US007919999B2

(12) United States Patent
Narayanan et al.

(10) Patent No.: US 7,919,999 B2

(45) Date of Patent: Apr. 5, 2011

(54) BAND-GAP REFERENCE VOLTAGE DETECTION CIRCUIT

(75) Inventors: Venkat Narayanan, Sunnyvale, CA (US); Qiang Tang, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 192 days.

(21) Appl. No.: 12/025,587

(22) Filed: Feb. 4, 2008

(65) Prior Publication Data

US 2009/0195301 A1 Aug. 6, 2009

Related U.S. Application Data

(63) Continuation-in-part of application No. 11/874,609, filed on Oct. 18, 2007, now Pat. No. 7,564,279.

(51) Int. Cl.
*H03L 7/00* (2006.01)

(52) U.S. Cl. ............................ 327/143; 327/7; 327/539

(58) Field of Classification Search .................... 327/77, 327/143, 539

See application file for complete search history.

(56) References Cited

U.S. PATENT DOCUMENTS

| | | | | |
|---|---|---|---|---|
| 5,907,262 | A | 5/1999 | Graeme et al. | |
| 6,118,264 | A | 9/2000 | Capici | |
| 6,225,850 | B1 * | 5/2001 | Opris | 327/356 |
| 6,407,622 | B1 * | 6/2002 | Opris | 327/539 |
| 6,441,680 | B1 | 8/2002 | Leung et al. | |
| 6,563,370 | B2 * | 5/2003 | Coady | 327/539 |
| 6,958,643 | B2 | 10/2005 | Rosenthal | |
| 6,989,708 | B2 | 1/2006 | Xi | |
| 7,142,042 | B1 | 11/2006 | Henry | |
| 7,564,279 | B2 * | 7/2009 | Tang et al. | 327/143 |
| 2007/0081377 | A1 | 4/2007 | Zheng | |

* cited by examiner

*Primary Examiner* — Lincoln Donovan
*Assistant Examiner* — John W Poos
(74) *Attorney, Agent, or Firm* — Brooks, Cameron & Huebsch, PLLC

(57) ABSTRACT

Methods, devices, modules, and systems for a band-gap reference voltage detection circuit are provided. One embodiment for a band-gap reference voltage detection circuit includes a Brokaw cell having a band-gap reference voltage, and a circuit portion for indicating the magnitude of an input voltage signal with respect to the band-gap reference voltage. The input voltage is applied to transistor bases of the Brokaw cell.

23 Claims, 6 Drawing Sheets

BAND-GAP REFERENCE VOLTAGE DETECTION CIRCUIT

CROSS-REFERENCE TO RELATED APPLICATIONS

This application is a continuation in part of U.S. patent application Ser. No. 11/874,609, entitled "Power On Reset Circuitry in Electronic Systems," filed 18 Oct. 2007, now U.S. Pat. No. 7,564,279, the specification of which are herein incorporated by reference.

BACKGROUND

Most electronic systems and devices contain circuits, logic and storage elements, e.g., memory, which have indeterminate states when the primary power source for the system is first applied, or when the power source drops below some minimum operating level. The circuits, logic and storage elements, e.g., memory devices, are typically provided as internal, semiconductor, integrated circuits in computers or other electronic devices. There are many different types of memory random-access memory (RAM), read only memory (ROM), dynamic random access memory (DRAM), synchronous dynamic random access memory (SDRAM), and flash memory, among others. Memory devices are utilized for a wide range of electronic applications including personal computers, personal digital assistants (PDAs), digital cameras, cellular telephones, etc.

Incorrect and/or unreliable data can be read from the circuits, logic and storage elements, e.g., memory, during power up due to the fact that the supply voltage of the device is ramping from zero volts to a Vcc level. An incorrect read operation can result in operational errors such as erroneous redundancy address selection or erroneous trimming operations, failure to boot, etc. Therefore, it is desirable and often necessary, to provide some means whereby the storage elements are set to a known state at initial power on or after a power drop. Such circuits are sometimes referred to as power-on reset (POR) circuits.

POR circuitry is often used in memory devices to insure proper functionality of the device when power is initially applied to the device, e.g., during power on of the device, and to insure proper functionality of the device if power to the device is temporarily lost. Power-on reset circuits can prevent various internal circuits of the memory device, e.g., logic circuits, processors, latches, charge pumps, and voltage regulators, among others, from functioning until after the POR circuit determines that the applied supply voltage, e.g., Vcc, is adequate to insure proper circuit function.

A wide variety of internal circuits are dependent on POR supervision of their functionality with respect to available voltage supply. The various circuits within a given electronic device or system can have differing acceptable voltage supply requirements. In previous approaches, either one voltage threshold was selected that satisfied the voltage supply requirements of all dependent circuits delaying power-up of some circuits with lower acceptable voltage thresholds, or multiple PORs were applied to supervise the multiple voltage supply thresholds, using more circuit real estate and increasing costs.

One difficulty in implementing POR circuits is that such circuits are often be powered by the same voltage source that is monitored by the circuit. This can present a challenge, particularly if the circuit is used to ensure that the system is in a proper initial state at relatively low supply voltages. Furthermore, POR circuits should operate reliably when the input supply voltage either has a very fast rise time or a slow rise time. Additionally, the electronic deices and systems of today operate in a wide range of temperature environments. As such, POR circuits should be able to function accurately in determining voltage supply suitability for the circuits they supervise over a range of temperature variations.

DETAILED DESCRIPTION

Methods, devices, modules, and systems for a band-gap reference voltage detection circuit are provided. One embodiment for a band-gap reference voltage detection circuit includes a Brokaw cell having a band-gap reference voltage, and a circuit portion for indicating the magnitude of an input voltage signal with respect to the band-gap reference voltage. The input voltage is applied to transistor bases of the Brokaw cell.

One or more embodiments of the present invention are capable of detecting a particular threshold level of an input signal, such as power supply voltage, while being powered by such input signals. In various embodiments presently disclosed, the threshold detection circuit is provided to accommodate input signals having fast and slow rising or falling inputs, and maintain a reliable threshold detection level relatively insensitive to temperature and process variations.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Figure 1A:
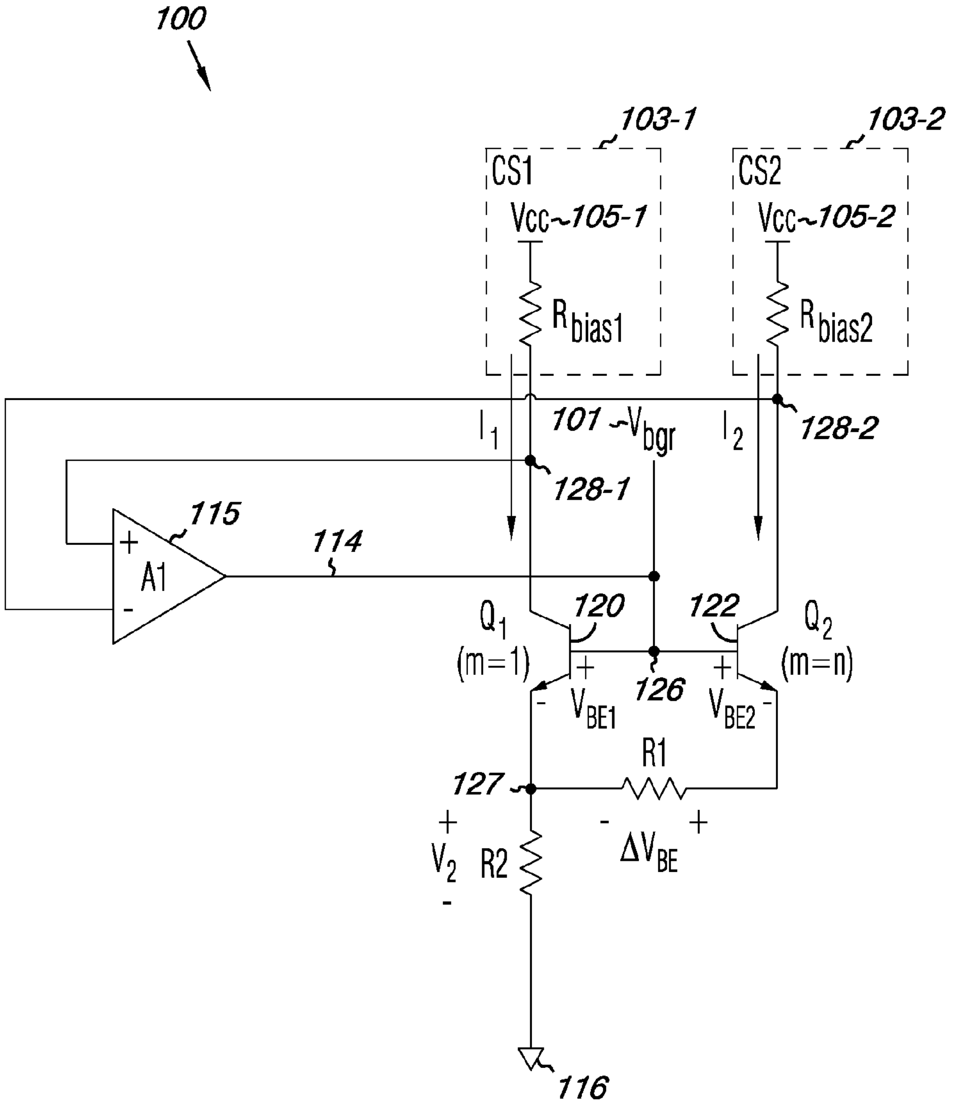
Fig. 1A PRIOR ART
FIG. 1A illustrates a Brokaw band-gap reference voltage circuit according to a previous approach.

FIG. 1A illustrates a Brokaw band-gap reference voltage circuit according to a previous approach. A reference voltage circuit is an electronic circuit that in intended to provide a process and temperature-stable output voltage. The reference voltage is often used in applications requiring a predefined voltage magnitude to which other voltages in the application can be compared. Components and circuits such as voltage regulators, analog-to-digital converters, digital-to-analog converters, multimeters, frequency-to-voltage converters, transducer circuits, voltage controlled oscillators, amplifiers, and other instrumentation and measurement circuits all use a reference voltage to properly function. Accuracy of these systems can be limited by the precision of the voltage reference implemented therein.

Temperature coefficient is one parameter for describing the performance of a voltage reference in terms of its capability to keep a reference voltage level consistent over a given temperature range. Temperature coefficient is defined as the change in voltage divided by the change in temperature:

TC(V)=Delta V/Delta T

A temperature-compensated voltage reference is achieved by using two temperature-sensitive sources of voltage, with opposing temperature coefficients to compensate for the variations of one another. A temperature-compensated voltage reference is designed to compensate for one source of voltage having a negative temperature coefficient, i.e., voltage decreases with increasing temperature, using another source of voltage having a positive temperature coefficient of another voltage drop. With proper scaling between the two, a nominally zero temperature coefficient can be achieved with temperatures variations of the combined output being cancelled out.

The circuit illustrated in FIG. 1A is one example of a temperature-compensated voltage reference according to a previous approach. The Brokaw band-gap reference voltage circuit 100 includes a first current source (CS1) 103-1, e.g., a first bias resistor (Rbias1) having a first connection 105-1 to a voltage supply (Vcc), and a first bipolar junction transistor (Q1) 120 having a collector connected to the first current source (CS1) 103-1, a base, and an emitter. The voltage reference circuit 100 includes a second current source (CS2) 103-2, e.g., a second bias resistor (Rbias2) having a second connection 105-2 to the voltage supply (Vcc), and a second bipolar junction transistor (Q2) 122 having a collector connected to the second current source (CS2) 103-2, a base connected to the base of the first bipolar junction transistor (Q1) 120, and an emitter. The first (Rbias 1) and second (Rbias2) bias resistors are selected to be substantially equivalent in size. The base-emitter area (m) of the second bipolar junction transistor (Q2) 122 is n times larger than the base-emitter area of the first bipolar junction transistor (Q1) 120. Thus, n is the ratio of the multiplicities of the two BJT devices. A first resistance, e.g., resistor (R1), is connected between the emitters of the first (Q1) 120 and second bipolar junction transistors (Q2) 122. A second resistance, e.g., resistor (R2), is connected between the emitter of the first bipolar junction transistor (Q1) 120 and a ground reference potential 116. A feedback loop is formed using an operational amplifier (A1) 115 having a non-inverting input (+) connected to the collector of the first bipolar junction transistor (Q1) 120, an inverting input (−) connected to the collector of the second bipolar junction transistor (Q2) 122, and an output connected to the bases of the first (Q1) 120 and second (Q2) 122 bipolar junction transistors. The band-gap reference voltage (Vbgr) 101 is available at the output 114 of the operational amplifier (A1) 115.

The Brokaw band-gap reference voltage circuit 100 is implemented to maintain the temperature insensitivity of the band-gap and provide a stable voltage output for use as a reference voltage, e.g. for subsequent comparisons to other operating voltage levels, despite temperature and process variations. In general, this circuit operates by forcing equivalent currents, from the respective current sources, e.g., CS1 and CS2, through the two bipolar junction transistors (BJT), e.g., Q1 and Q2, stages using the feedback loop. The operational amplifier (A1) 115 functions as a high gain comparator of a differential signal created as a result of the difference in band-gap voltages. The voltage presented to the inputs to the comparator, e.g., A1, are the source voltage, e.g., Vcc, minus the drop across the respective bias resistance, e.g., bias resistor Rbias 1 and Rbias2. More specifically, the voltage at node 128-1, connected to the non-inverting (+) input to the comparator 115, is Vcc−I1*Rbias1, and the voltage at node 128-2, connected to the inverting (−) input to the comparator 115, is Vcc−I2*Rbias2. As the reader will appreciate, with the two bias resistors being of substantially equivalent size, and the source voltage, e.g., Vcc, being the same supply voltage, the voltage differential signal into the comparator 115 will be proportional to the current differential passed through the two respective BJTs, e.g. Q1 and Q2. And because the emitter area of the second BJT (Q2) is n times larger than the emitter area of the first BJT (Q1), current, e.g., I2, will flow more easily in the second BJT (Q2) than current, e.g., I1, flowing through the first BJT (Q1). However, the relatively easier current path through the second BJT (Q2) is offset by the presence of additional resistance, e.g., R1, in the path of current, e.g., I2, flowing through the second BJT (Q2).

The circuit 100 further functions to attempt to reach and maintain equilibrium at a stable operating condition, e.g., the bases of the BJTs being biased at a quiescent operating point. When the bias voltage level, e.g., Vbgr, at the bases of the two BJTs, e.g., Q1 and Q2, is higher than the quiescent operating point, the transistors, e.g., Q1 and Q2, are conducting, and a large current is forced through R2 to the ground reference 116, limited by the circuit resistors, e.g., Rbias1, Rbias2, R1 and R2. As one skilled in the art will appreciate, the voltage developed across R1 ($\Delta V_{BE}$) will limit the current flowing through the second BJT (Q2) 122 but not that flowing through the first BJT (Q1) 120. As a result, the voltage at the collector of the first (Q1) 120 and second (Q2) 122 BJTs, e.g., at nodes 128-1 and 128-2, will be different, i.e., by the voltage amount across R1 ($\Delta V_{BE}$). This differential voltage, e.g., $\Delta V_{BE}$, under these conditions is coupled to the inputs of the operational amplifier (A1), with the lower voltage level being presented to the positive terminal. The differential voltage presented to the operational amplifier (A1) under these circumstances will tend to decrease the output of the operational amplifier (A1), thereby driving down the base voltage, e.g., Vbgr, of the two BJTs, e.g., Q1 and Q2, down to the quiescent operating point, i.e., towards lower bias, and output voltages, e.g., Vbgr.

When the voltage level, e.g., Vbgr, at the bases of the two BJTs, e.g., Q1 and Q2, is lower than the quiescent operating voltage value, a smaller current is forced through R2 to the ground reference 116. As one skilled in the art will appreciate, the second BJT (Q2) 122, having an emitter area n times larger, will take more current than the first BJT (Q1) 120 attributable to its larger emitter area. The voltage drop across Rbias2 will now be greater than the drop across Rbias 1, due to the larger current through the second BJT (Q2) 122 relative to the first BJT (Q1) 120, and a differential voltage signal will once again be presented to the comparator 115. Under these conditions, the relatively lower voltage level will be at the collector of the second BJT (Q2), e.g., node 128-2, connected to the inverting (−) input to the operational amplifier (A1), causing the output of the operational amplifier (A1) to increase, and attempting to drive up the base voltage, e.g., Vbgr, of the two BJTs, e.g., Q1 and Q2, to the quiescent operating point, i.e., towards a higher bias voltage. Between these two above-described conditions, e.g., at the quiescent operating point, the output reference voltage, e.g., Vbgr, is stable and fairly temperature insensitive.

The difference between the base-emitter junction voltages ($\Delta V_{BE}$) of the two BJTs, e.g., Q1 and Q2, is dependent on absolute temperature (T), the ratio of the multiplicities (n) of the two BJT devices, and the ideality factor of the forward-base-emitter junction characteristic ($\eta$) according to the following formula:

$$\Delta V_{BE}=V_{BE1}-V_{BE2}=\eta k_B T 1n(n)/q$$

As one skilled in the art will appreciate, the thermal voltage ($V_T$) has a positive temperature coefficient and is equal to:

$$V_T=\eta k_B T/q$$

At the quiescent operating point, equal current is flowing in each BJT, which are respectively operating in the saturation region. The saturation current ratio can be expressed in terms of the emitter area ratio, i.e., n, and expressed in simplified form as:

$$\Delta V_{BE}=V_T 1n(n)$$

The current (I2) flowing through R1 is:

$$I2=\Delta V_{BE}/R1=V_T 1n(n)/R1$$

Since the same current is flowing in both BJTs at the quiescent operating point, the current through R2 is twice the current I2, and the voltage across R2 can be expressed as:

$$V2=(2V_T 1n(n)/R1)\times R2=2R2V_T 1n(n)/R1$$

Then the band-gap reference voltage can be expressed as:

$$Vbgr=V_{BE1}+V2=V_{BE1}+2R2V_T 1n(n)/R1$$

The base-emitter voltage, $V_{BE}$, is also effectively proportional to absolute temperature (PTAT), but has a negative temperature coefficient of approximately −0.2 mV/° C. in the operating range of interest, e.g., in the vicinity of room temperature. Temperature and process insensitivity of the band-gap reference voltage (Vbgr) circuit is sought by scaling $\Delta V_{BE}$ appropriately, and adding it to the base-emitter voltage, $V_{BE}$, thus summing quantities having offsetting changes due to temperature. For the Brokaw band-gap reference voltage circuit 100 shown in FIG. 1:

$$Vbgr=V_{BE1}+[(2R2/R1)\times V_T 1n(n)]$$

With a proper choice of the resistor ratio R2/R1, the compensating voltage for the base-emitter voltage can be tuned to lie on the inflection point of the temperature variation curve at a selected temperature.

Figure 1B:
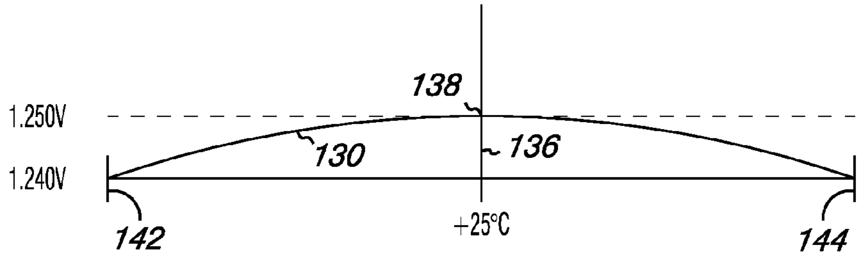
Fig. 1B PRIOR ART
FIG. 1B illustrates band-gap reference voltage as a function of temperature for a Brokaw circuit of the previous approach shown in FIG. 1.

FIG. 1B illustrates band-gap reference voltage as a function of temperature for a Brokaw circuit of the previous approach shown in FIG. 1A. An example band-gap reference voltage, Vbgr, curve 130 for a Brokaw circuit is plotted across some temperature range between a first temperature 142 and a second temperature 144, with an inflection point 138 near room temperature, e.g., +25° C. at 136. In the example of FIG. 1B, the band-gap reference voltage, Vbgr, is tuned for an uppermost magnitude of 1.250V, e.g., at the inflection point 138. As can be seen from FIG. 1B, the band-gap reference voltage decreases as the temperature varies away from the temperature at which the inflection point occurs (shown dropping to 1.240V). From the equations provided above, and assuming the ideality factor ($\eta$) is unity (ideal base-emitter junction), the band gap voltage for silicon BJTs is around 1.25 V as shown by way of an example in FIG. 1B. Although the temperature range over which the 10 mV drop in the band-gap reference voltage occurs, as shown in FIG. 1B, the temperature variation is significantly less than the −2 mV/° C. temperature coefficient of a base-emitter voltage drop.

Band-gap reference voltage circuit 100 compensation is usually done with a scale factor, e.g., accomplished via the ratio between R1 and R2, to provide the proper matching between the two temperature-compensating voltage drops used to form the band-gap voltage. Maintaining the scaling factor is preferably as temperature and process independent as possible depends, at least in part, on the matching and tracking performance characteristics of the resistors implementing the scale factor, e.g., R1 and R2. Monolithic circuit technology has the advantage of good matching and tracking characteristics.

Figure 2:
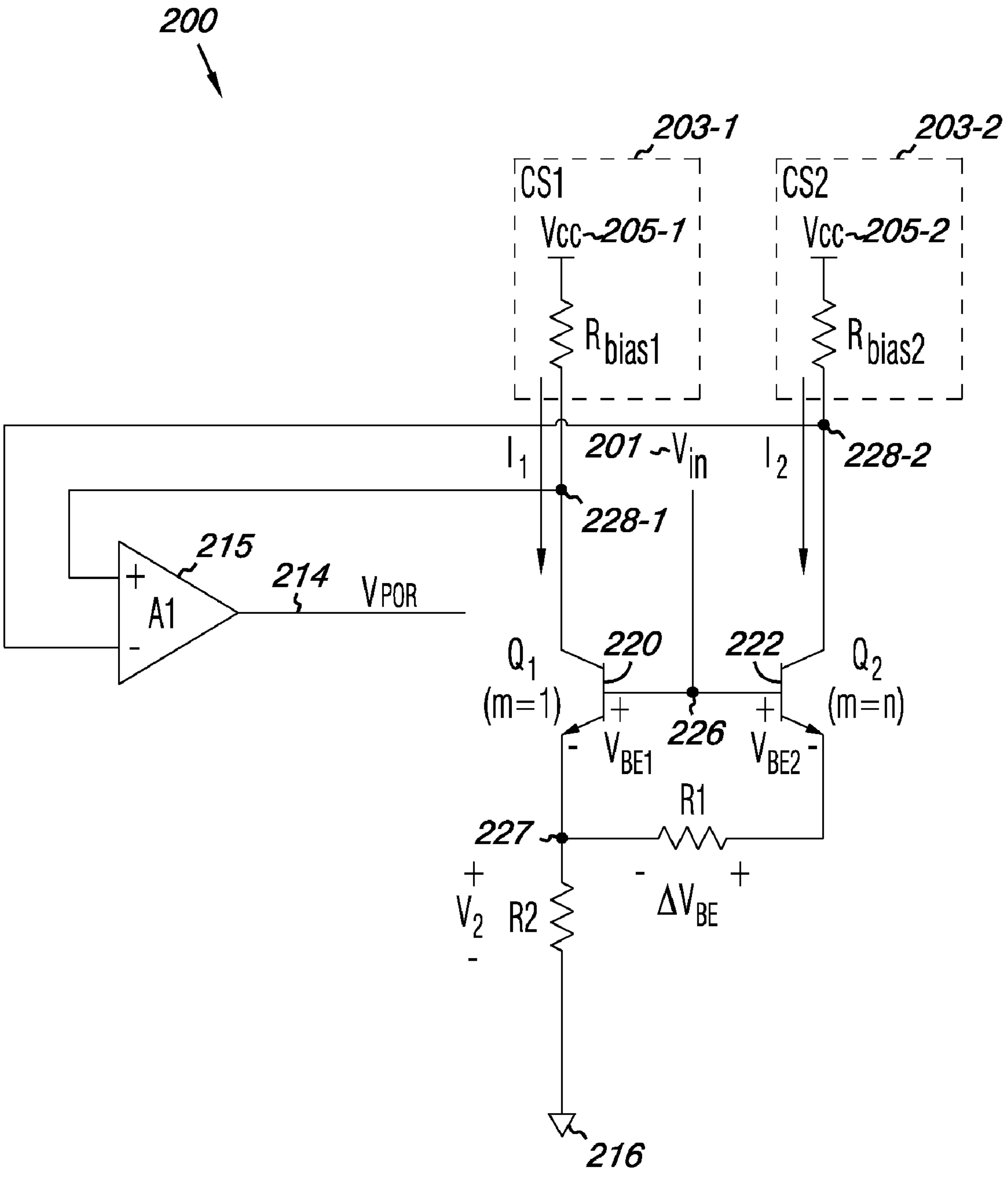
FIG. 2 illustrates a band-gap reference voltage detection circuit in accordance with an embodiment of the present disclosure.

FIG. 2 illustrates an example of a band-gap reference voltage detection circuit 200 that can be operated in accordance with one or more embodiments of the present disclosure. In one or more embodiments, a Brokaw band-gap reference voltage circuit, e.g., as shown in FIG. 1, is changed to have a threshold detection circuit that will yield a trip point at approximately the band-gap voltage. By opening the feedback loop at the output 214 of the high gain comparator 215, the output 214 of the operational amplifier (A1) is removed from biasing the bases of the two BJTs, e.g., Q1 and Q2. The output 214 of the operational amplifier (A1) is now taken as the output of the threshold detection circuit 200, according to one or more embodiments of the present invention.

An input voltage signal 201, e.g., Vin, is applied to bias the bases of the two BJTs, e.g., Q1 and Q2 (instead of the amplified differential signal feedback signal illustrated in FIG. 1). The band-gap reference voltage detection circuit 200 can yield a trip point when the input voltage, Vin, is more equivalent to the band-gap voltage level than the circuit shown in FIG. 1A. As mentioned above, the band-gap voltage level for silicon semiconductor devices, assuming ideal silicon junctions, is about 1.25 V. However, in actuality, the band-gap voltage level for the band-gap reference voltage detection circuit 200 can be somewhat lower, e.g., around 1.2V, for a 55 nanometer (nm) design rule node dimension which results in an ideality factor slightly larger than unity.

According to one or more embodiments of the present invention, the band-gap reference voltage detection circuit 200 can be configured as a power-on reset (POR) circuit if the input voltage, e.g., Vin, is coupled to a voltage supply. e.g., Vcc, for example, by connecting node 226 to the power supply, e.g., 205-1 and/or 205-2 (not shown in FIG. 2). The output 214 of the operational amplifier (A1) 215, e.g., $V_{POR}$, is connected to the internal circuitry that it is supervising, e.g., 506-1, 506-2 and 506-3 of FIG. 5 discussed below.

As the voltage supply is powered-up, the input voltage magnitude, Vin, ramps-up from zero, and the inputs to the band-gap voltage comparator 215 cross over at the band-gap voltage. The output 214 of the operational amplifier (A1) 215, e.g., $V_{POR}$, will flip from a first rail (e.g., a particular voltage of one polarity) to a second rail (e.g., a particular voltage of the other polarity) as the differential signal input to the operational amplifier (A1) cross over, and is amplified through the operational amplifier (A1) to produce the POR output 214 of the detected threshold, e.g., $V_{POR}$. This change in the output signal, e.g., from one rail to the other, connotes a "trip." One skilled in the art will appreciate that the band-gap reference voltage detection circuit 200 can "trip" back, e.g., from the second rail back to the first rail, should the input voltage (connected to the voltage supply) ramp down to re-cross the band-gap voltage, e.g., from Vcc to ground reference potential, e.g., a power-off reset circuit.

For the band-gap reference voltage detection circuit 200 to operate as a POR as described above, the BJTs, e.g., Q1 and Q2, are assumed to be biased in the current saturation region, i.e., the base-collector junctions cannot be forward biased significantly. This leads to practical constraints on the bias current resistor selections, e.g., Rbias1, Rbias2, R1, and R2. One having ordinary skill in the art will appreciate that the current through the two BJTs, e.g., Q1 and Q2, can be limited by the size of the resistor R2. The bias resistors, e.g., Rbias1 and Rbias2, are present to provide an amplified differential input to the comparator 215 at the trip point, e.g., by producing a voltage drop proportional to the different current values, e.g., I1 and I2, flowing through the two BJTs, e.g., Q1 and Q2.

Furthermore, the BJT branches and the comparator should be able to operate at the ramp rate of the input voltage signal, e.g., Vin, under nearly quasi-static conditions. In various implementations of one or more embodiments of the present invention, the size of the resistors affects the ramp rates at which the circuit is operable due to the intrinsic RC time constants of active-based resistors used in monolithic circuit fabrications.

In addition, the comparator 215 should be capable of operating at common modes close to the supply voltage rail, because the comparator 215 is driven, i.e., powered, by the ramp in the supply voltage. According to one or more embodiments of the present invention, the desire for high-common mode operation of the comparator 215 is satisfactorily met by utilizing a folded-cascode amplifier stage, which prevents the input differential pair of the amplifier from being driven out of saturation at high common modes.

The band-gap reference voltage detection circuit 200 and the comparator 215 operate with a lowest voltage node (LVN) differential stage. However, the common mode may be closer to the supply voltage being input, e.g., Vcc. Accordingly, the one or more of the present embodiments use a folded-cascode stage to prevent driving the input differential pair out of saturation.

Figure 3:
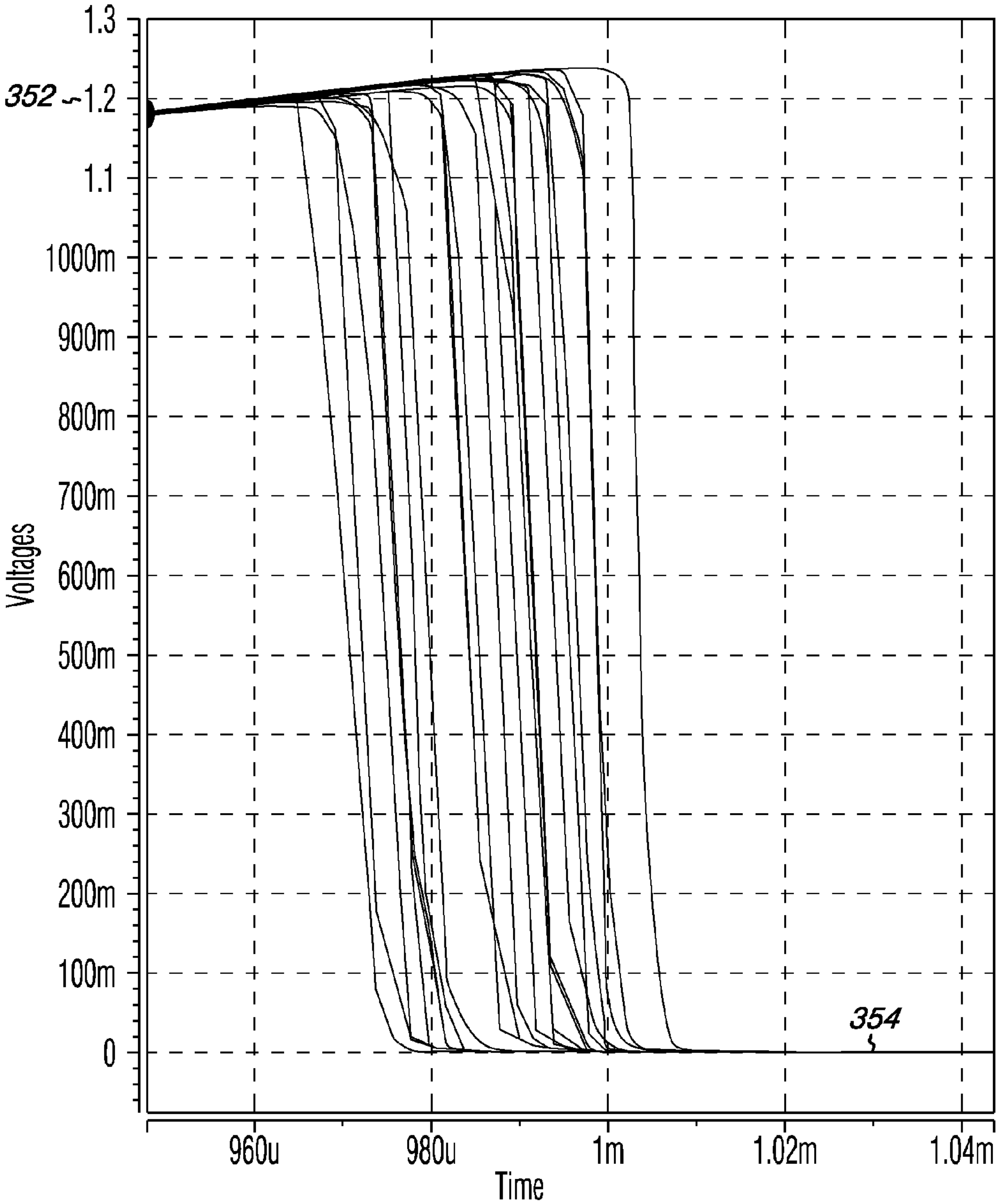
FIG. 3 illustrates performance characteristics of a band-gap reference voltage detection circuit in accordance with an embodiment of the present disclosure.

FIG. 3 illustrates performance characteristics of a band-gap reference voltage detection circuit, e.g., 200 in FIG. 2, in accordance with an embodiment of the present disclosure. FIG. 3 shows performance data for the band-gap voltage (volts using a linear scale on the vertical axis) plotted as a function of time (using a linear scale on the horizontal axis) illustrating trip point variation at five (5) different temperatures and five (5) different process corners, according to one or more embodiments of the present invention. As used herein, the 5 different process corners include TT (typical/typical-representing typical expected performance for nMOS devices, and typical expected performance for pMOS devices according to particular design specifications), SS (slow/slow-representing both NMOS and pMOS devices are slower than expected), FF (fast/fast-representing both NMOS and pMOS devices are faster than expected), WP or WN (weak pMOS or weak nMOS-representing one type of device is weaker than expected, e.g., Vt is slightly higher and current lower, and that the other type of device may be slightly stronger than expected, e.g., Vt is slightly lower and current higher). The expected performance is provided as a range values with typical being the average in the range. As the reader will appreciate, the actual performance value, e.g., for current drive and Vt, may vary due to doping fluctuations, etc., encountered in the fabrication process. Performance variations also occur under different environmental conditions when the device is placed in use. Hence, the 5 different temperatures used were −40, 0, 25, 50, and 100° C.

As shown in FIG. 3 of the plots of the different process corner and temperature combinations, the one or more embodiments of the present invention provide band-gap reference voltage detection circuit having trip points 352 which are clustered within about +/−50 millivolts (mV) around the band gap reference voltage, e.g., 1.2 V, for the detection circuit as measured from the ground reference potential 354. As shown, the less than 50 mV variation is achieved for the above-mentioned particular temperature range, e.g., across five (5) different temperatures, associated with a particular operating environment and for a particular range of process corners, e.g., the above-mentioned five (5) different process corners, and as associated with a particular design rule node dimension, e.g., a 50 nm design rule memory node dimension or smaller for a device operating at an expected Vt of 0.8 V. In this example embodiment, the change in Vt due to process corner variation from slow/slow to fast/fast was +/−100 mV, e.g., Vt ranged from 0.7-0.9 V. Additional change in Vt due to the range of temperature variation mentioned above can add another +/−100 mV, e.g., Vt being lower at warmer temperatures and higher at colder temperatures.

Figure 4:
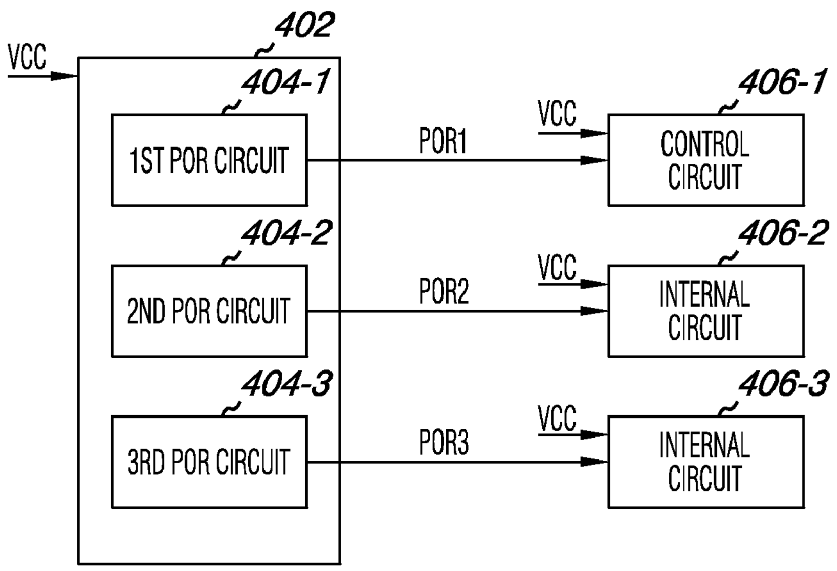
Fig. 4 PRIOR ART
FIG. 4 is a functional block diagram of a power-on reset circuit application according to a previous approach.

FIG. 4 illustrates an example of POR circuitry 402 associated with providing POR signals to internal circuitry of an electronic device, e.g., 406-1, 406-2, 406-3, according to a previous approach. In the example shown in FIG. 4, the POR circuitry 402 includes a number of distinct POR circuits, e.g., 404-1, 404-2, and 404-3. Each respective POR circuit 404-1, 404-2, and 404-3 is used to detect when the applied power supply voltage, e.g., Vcc, reaches a respective particular voltage level. That is, each POR circuit 404-1, 404-2, and 404-3 includes one associated "trip level," e.g., one associated detected threshold of the supply voltage level at which the respective POR is set to indicate. As the reader will appreciate, the applied power supply voltage, e.g., Vin, can ramp from an initial voltage, e.g., a ground reference voltage, to a substantially steady operating voltage level, e.g., Vcc, during powering-up of the electronic device. In such cases, various internal circuits of the device, e.g., 406-1, 406-2, 406-3, may not consistently function properly, or accurately, until the ramping supply voltage has reached an adequate voltage level particular to the respective circuit, which may be different for the various respective internal circuits, e.g., 406-1, 406-2, 406-3. For instance, some internal circuits, e.g., 406-1, 406-2, 406-3, may function properly when the applied supply voltage reaches a level of about 1.2V, while some other internal circuits of the system may not function properly until the applied supply voltage reaches a higher level, e.g., 1.4V, 1.5V, 2.0V, etc.

The example illustrated in FIG. 4 includes a number of internal circuits, e.g., 406-1, 406-2, 406-3. In this example, the supply voltage that is adequate to insure proper operation of the internal circuitry is different for each internal circuit, e.g., 406-1, 406-2, 406-3. As such, each internal circuit, e.g., 406-1, 406-2, 406-3, needs to receive a separate POR signal when the supply voltage reaches the particular voltage level that is adequate for proper operation of the particular internal circuit, e.g., 406-1, 406-2, 406-3. In the example of FIG. 4, the different trip levels associated with the POR circuits, e.g., 404-1, 404-2, and 404-3, correspond to the respective different supply voltage levels to insure proper operation of the corresponding internal circuits, e.g., 406-1, 406-2, 406-3.

As the reader will appreciate, POR circuit 404-1 provides a first POR signal, e.g., POR1, indicating a "trip" to internal circuit 406-1 when the applied voltage supply, e.g., Vcc, sufficiently rises, and the POR circuit 404-1 detects that the supply voltage has reached the voltage threshold level to which it is set (which is sufficient to insure proper operation of internal circuit 406-1). Similarly, POR circuit 404-2 provides a second POR signal, e.g., POR2, to internal circuit 406-2 when the POR circuit 404-2 "trips," e.g., in response to POR circuit 404-2 detecting that the input supply voltage, e.g., Vcc, has reached the minimum voltage level sufficient to insure proper operation of internal circuit 406-2. POR circuit

404-3 provides a third POR signal, e.g., POR3, to internal circuit 406-3 when the POR circuit 404-3 trips, e.g., in response to POR circuit 404-3 detects that the supply voltage has reached the minimum voltage level sufficient to insure proper operation of internal circuit 406-3.

However, providing electronic devices and systems having POR circuitry such as POR circuitry 402 illustrated in the example shown in FIG. 4 can have various drawbacks as compared to embodiments of the present disclosure. For instance, providing multiple POR signals, e.g., POR1, POR2, and POR 3, from a number of separate POR circuits, e.g., 404-1, 404-2, and 404-3, can occupy significantly more area on an integrated circuit chip than embodiments of the present disclosure.

Figure 5:
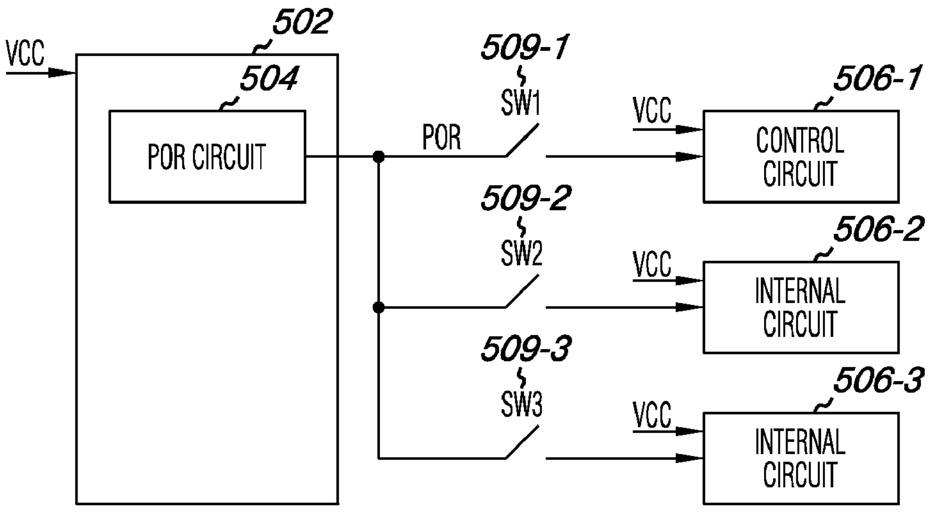
FIG. 5 is a functional block diagram of a power-on reset circuit application in accordance with an embodiment of the present disclosure.

FIG. 5 is a functional block diagram of a power-on reset circuit application in accordance with an embodiment of the present disclosure. POR circuitry 502 associated with providing POR signals to internal circuitry of an electronic device, e.g., 506-1, 506-2, 506-3 includes a single POR circuit 504, e.g. the band-gap reference voltage detection circuit 200 in FIG. 2, having its input connected to the supply voltage source through a voltage divider, and its output being connected through switches, e.g., SW1 509-1, SW2 509-2 and SW3 509-3, to respective internal circuits, e.g., 506-1, 506-2, 506-3.

In this manner, a single POR circuit, e.g., POR circuit 200 described below in FIG. 2, can be operated with multiple "trip" points in conjunction with an adjustable input voltage source, e.g., a switchable voltage divider powered by the supply voltage, and thus can provide multiple POR signals in response to detection of the supply voltage reaching different adjusted trip levels. One skilled in the art will appreciate the circuit real estate saved in implementing a single band-gap reference voltage detection circuit POR in place of the multiple discrete PORs shown in FIG. 4.

Figure 6:
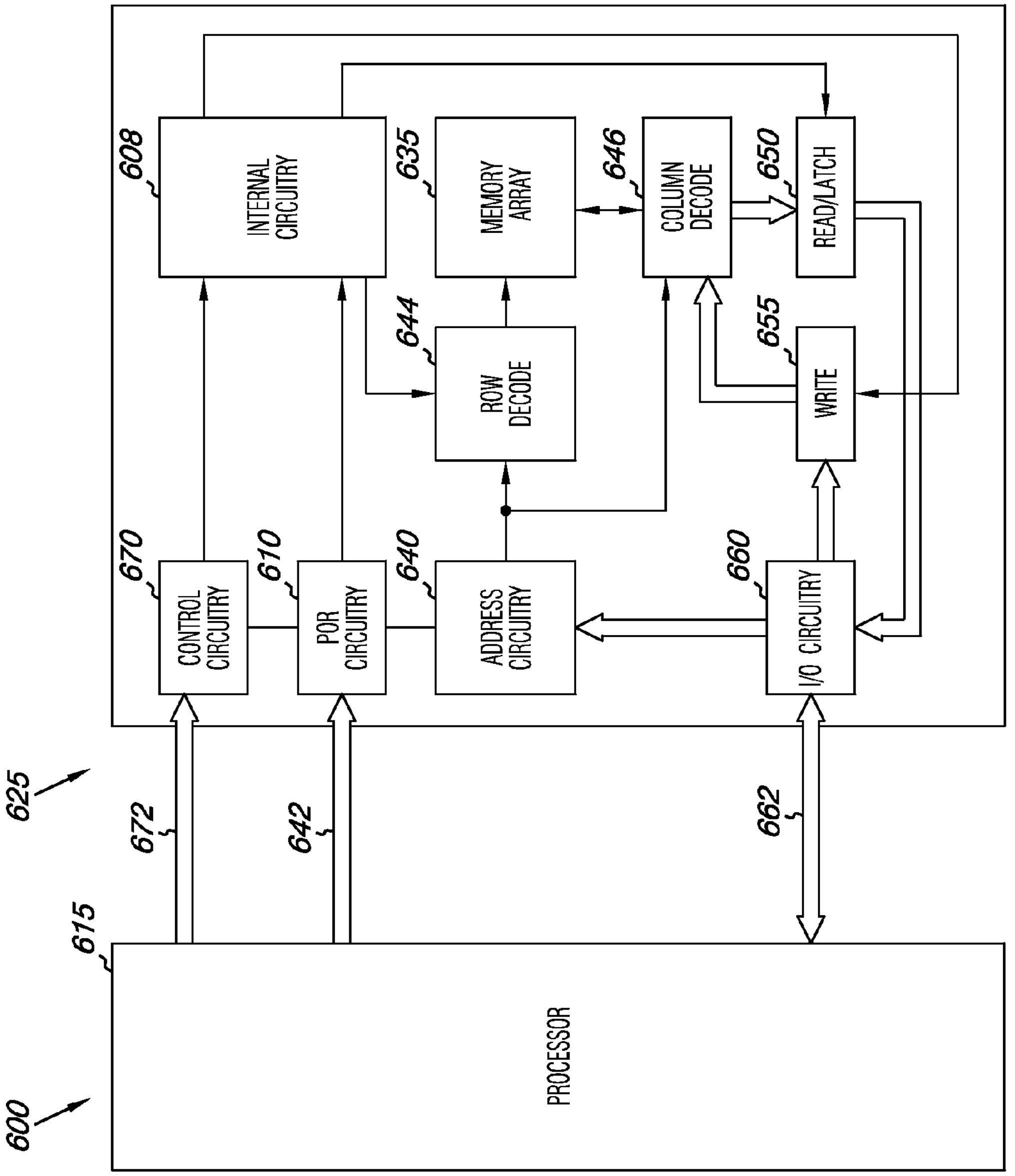
FIG. 6 is a functional block diagram of an electronic memory system having at least one power-on reset circuit in accordance with an embodiment of the present disclosure.

FIG. 6 is a functional block diagram of an electronic memory system 600 having at least one memory device 625 in accordance with an embodiment of the present disclosure. Memory system 600 includes a processor 615 coupled to a memory device 625 that includes a memory array 635 of memory cells. The memory device 625 can include an array 635 of non-volatile memory cells, e.g., floating gate memory cells, which can be arranged in a NAND architecture or a NOR architecture.

The memory system 600 can include separate integrated circuits or both the processor 615 and the memory device 625 can be on the same integrated circuit. The processor 615 can be a microprocessor or some other type of controlling circuitry such as an application-specific integrated circuit (ASIC).

The embodiment of FIG. 6 includes address circuitry 640 to latch address signals provided over I/O connections 662 through I/O circuitry 660. Address signals are received and decoded by a row decoder 644 and a column decoder 646 to access the memory array 635. In light of the present disclosure, it will be appreciated by those skilled in the art that the number of address input connections depends on the density and architecture of the memory array 635 and that the number of addresses increases with both increased numbers of memory cells and increased numbers of memory blocks and arrays.

The memory device 625 reads data in the memory array 635 by sensing voltage and/or current changes in the memory array columns using sense/buffer circuitry that in this embodiment can be read/latch circuitry 650. The read/latch circuitry 650 can read and latch a page or row of data from the memory array 635. I/O circuitry 660 is included for bi-directional data communication over the I/O connections 662 with the processor 615. Write circuitry 655 is included to write data to the memory array 635.

Control circuitry 670 decodes signals provided by control connections 672 from the processor 615. These signals can include chip signals, write enable signals, and address latch signals that are used to control the operations on the memory array 635, including data read, data write, and data erase operations. In various embodiments, the control circuitry 670 is responsible for executing instructions from the processor 615 to perform the operating embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

In the embodiment illustrated in FIG. 6, the memory device 625 includes power on reset (POR) circuitry 610. The POR circuitry 610 can include a POR circuit such as POR circuit 200 shown in FIG. 2. The POR circuitry 610 is coupled to control circuitry 670, address circuitry 640, and internal circuitry 608. The internal circuitry 608 can include various internal circuits of memory device 625 including, but not limited to, fuse circuits, reference voltage circuits, and/or charge pump circuits, among other internal circuits that can be used to perform operations on the memory array 635 of device 625.

The POR circuitry 610 can be used in one or more embodiments in a memory device and in a processing system including processor 615, to prevent various internal circuits, e.g., 608, within the memory device of system from operating until the power supply voltage, e.g., Vcc, reaches a voltage level adequate for proper operation of the particular internal circuit. As described herein above, in various embodiments of the present disclosure, the POR circuitry 610 includes a POR circuit having an output signal that can be configured to trip at multiple VCC trip voltage levels. In some such embodiments, each Vcc trip voltage level associated with the POR circuit can correspond to a particular Vcc voltage level adequate to insure proper functioning of one or more internal circuit of the device.

Figure 7:
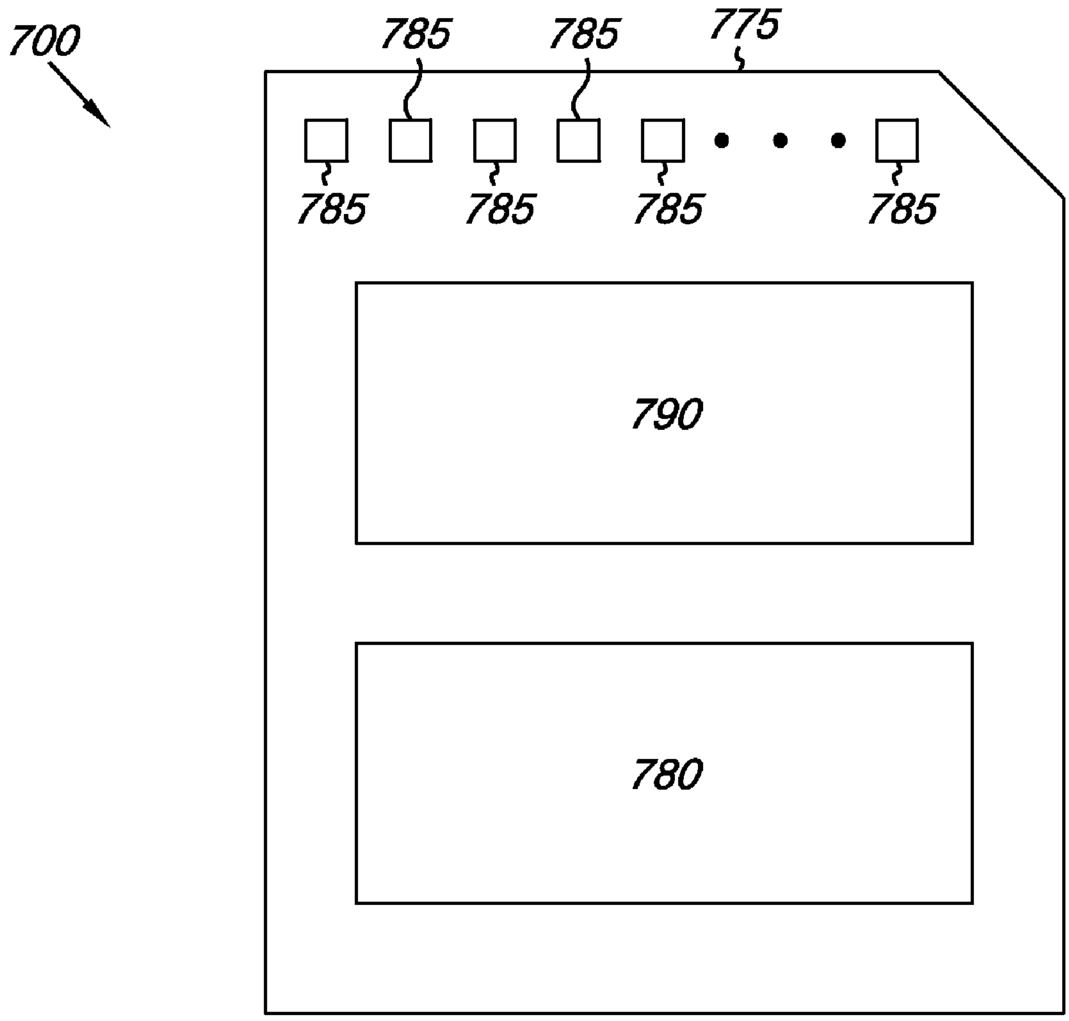
FIG. 7 is a functional block diagram of a memory module having at least one band-gap reference voltage detection circuit in accordance with an embodiment of the present disclosure.

FIG. 7 is a functional block diagram of a memory module 700 having at least one memory device having a POR utilizing a band-gap reference voltage detection circuit in accordance with an embodiment of the present disclosure. Memory module 700 is illustrated as a memory card, although the concepts discussed with reference to memory module 700 are applicable to other types of removable or portable memory (e.g., USB flash drives) and are intended to be within the scope of "memory module" as used herein. In addition, although one example form factor is depicted in FIG. 7, these concepts are applicable to other form factors as well.

In some embodiments, memory module 700 will include a housing 775 (as depicted) to enclose one or more memory devices 780, though such a housing is not essential to all devices or device applications. At least one memory device 780 includes an array of non-volatile memory cells and fuse circuitry that can be operated according to embodiments described herein. Where present, the housing 705 includes one or more contacts 785 for communication with a host device. Examples of host devices include digital cameras, digital recording and playback devices, PDAs, personal computers, memory card readers, interface hubs and the like. For some embodiments, the contacts 785 are in the form of a standardized interface. For example, with a USB flash drive, the contacts 785 might be in the form of a USB Type-A male connector. For some embodiments, the contacts 785 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 785 provide an interface for passing control, address and/or data signals between the memory module 700 and a host having compatible receptors for the contacts 785.

The memory module 700 may optionally include additional circuitry 790, which may be one or more integrated circuits and/or discrete components. For some embodiments, the additional circuitry 790 may include control circuitry, such as a memory controller, for controlling access across multiple memory devices 780 and/or for providing a translation layer between an external host and a memory device 780. For example, there may not be a one-to-one correspondence between the number of contacts 785 and a number of 780 connections to the one or more memory devices 780. Thus, a memory controller could selectively couple an I/O connection (not shown in FIG. 7) of a memory device 780 to receive the appropriate signal at the appropriate I/O connection at the appropriate time or to provide the appropriate signal at the appropriate contact 785 at the appropriate time. Similarly, the communication protocol between a host and the memory module 700 may be different than what is required for access of a memory device 780. A memory controller could then translate the command sequences received from a host into the appropriate command sequences to achieve the desired access to the memory device 780. Such translation may further include changes in signal voltage levels in addition to command sequences.

The additional circuitry 790 may further include functionality unrelated to control of a memory device 780 such as logic functions as might be performed by an ASIC. Also, the additional circuitry 790 may include circuitry to restrict read or write access to the memory module 700, such as password protection, biometrics or the like. The additional circuitry 790 may include circuitry to indicate a status of the memory module 700. For example, the additional circuitry 790 may include functionality to determine whether power is being supplied to the memory module 700 and whether the memory module 700 is currently being accessed, and to display an indication of its status, such as a solid light while powered and a flashing light while being accessed. The additional circuitry 790 may further include passive devices, such as decoupling capacitors to help regulate power requirements within the memory module 700.

CONCLUSION

Methods, devices, modules, and systems for a band-gap reference voltage detection circuit have been shown. One embodiment for a band-gap reference voltage detection circuit includes a Brokaw cell having a band-gap reference voltage, and a circuit portion for indicating the magnitude of an input voltage signal with respect to the band-gap reference voltage. The input voltage is applied to transistor bases of the Brokaw cell.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A band-gap reference voltage detection circuit comprising:
- a Brokaw cell having a band-gap reference voltage;
- a circuit portion for indicating the magnitude of an input voltage signal with respect to the band-gap reference voltage;
- wherein the input voltage is applied to transistor bases of the Brokaw cell; and
- wherein the input voltage signal is proportional to a voltage source supplying current to the Brokaw cell.

2. The detection circuit of claim 1, wherein the input voltage signal is derived from a switchable voltage divider circuit energized from the voltage source.

3. The detection circuit of claim 1, wherein an output of the circuit portion is connected to a power-on-reset circuit.

4. The detection circuit of claim 1, wherein the circuit portion includes an amplifier configured to receive a differential signal from the Brokaw cell based at least partially on the input voltage signal.

5. The detection circuit of claim 4, wherein the amplifier is configured to prevent driving Brokaw cell transistors out of saturation.

6. A band-gap reference voltage detection circuit comprising:
- a Brokaw cell configured to have an open differential signal feedback loop with band-gap transistor bases being biased by an input voltage signal;
- wherein the open differential signal feedback loop is amplified as an output;
- wherein the input voltage signal is driven by a supply voltage to the Brokaw cell; and
- wherein the output is amplified to provide a logic level signal indicative of the input voltage signal relative to a band-gap reference voltage of the Brokaw cell.

7. The detection circuit of claim 6, wherein the input voltage signal is proportional to the supply voltage and the logic level signal indicates the supply voltage level relative to a particular threshold.

8. The detection circuit of claim 6, wherein the output is connected to a power-on-reset circuit.

9. The detection circuit of claim 8, wherein the Brokaw cell is configured for temperature and process sensitivity of the band-gap reference voltage of less than 50 mV over a particular range of temperatures associated with a particular operating environment and over a particular range of process corners associated with a particular design rule.

10. The detection circuit of claim 9, wherein the Brokaw cell is configured for temperature insensitivity centered on a band-gap reference voltage of at least 1.2V.

11. The detection circuit of claim 6, wherein the open differential signal feedback loop includes a comparator configured to operate at common modes close to the supply rail.

12. A band-gap reference voltage detection circuit comprising:

a first current source (I1);

a second current source (I2);

a first bipolar junction transistor (Q1) having a collector connected to the first current source (I1), a base, and an emitter;

a second bipolar junction transistor (Q2) having a collector connected to the second current source (I2), a base connected to the base of the first bipolar junction transistor (Q1), and an emitter;

a first resistance (R1) connected between the emitters of the first (Q1) and second bipolar junction transistors (Q2);

a second resistance (R2) connected between the emitter of the first bipolar junction transistor (Q1) and a ground reference potential;

an operational amplifier (A1) having a non-inverting input (+) connected to the collector of the first bipolar junction transistor (Q1), an inverting input (–) connected to the collector of the second bipolar junction transistor (Q2), and an output; and wherein the base-emitter area of the second bipolar junction transistor (Q2) is N times larger than the base-emitter area of the first bipolar junction transistor (Q1), the transistor bases are configured to receive an input voltage different from the operational amplifier (A1) output, the operational amplifier (A1) output being is the band-gap reference voltage detection circuit output digitally indicating a magnitude of the input voltage relative to a band-gap reference voltage.

13. The band-gap reference voltage detection circuit of claim 12, wherein the first current source (I1) and the second current source each are composed of a bias resistance (Rbias) connected to a voltage source.

14. The band-gap reference voltage detection circuit of claim 13, wherein the first, second and bias resistances are active-based resistors sized to have intrinsic RC time constants faster than voltage source ramp rates.

15. The band-gap reference voltage detection circuit of claim 13, wherein the transistor bases are connected to the voltage source.

16. The band-gap reference voltage detection circuit of claim 13, wherein the transistor bases are connected to an intermediate junction of a voltage divider circuit energized from the voltage source.

17. The band-gap reference voltage detection circuit of claim 12, wherein N is 10.

18. The band-gap reference voltage detection circuit of claim. 12, wherein the operational amplifier (A1) output is connected to a power-on-reset circuit.

19. A method of operating a Brokaw band-gap cell, the method comprising:

opening a feedback loop for an amplified differential signal of the band-gap cell;

biasing band-gap transistor bases with an input voltage signal;

outputting the amplified differential error signal as an indication the input voltage signal crossing a band-gap voltage level; and wherein the input voltage signal is proportional to a voltage source supplying current to the Brokaw cell.

20. A band-gap reference voltage detection circuit comprising:

a Brokaw cell having a band-gap reference voltage;

a circuit portion for indicating the magnitude of an input voltage signal with respect to the band-gap reference voltage;

wherein the input voltage is applied to transistor bases of the Brokaw cell; and wherein the circuit portion includes an amplifier configured to:

receive a differential signal from the Brokaw cell based at least partially on the input voltage signal; and prevent driving Brokaw cell transistors out of saturation.

21. The detection circuit of claim 20, wherein the amplifier is a folded-cascode amplifier based comparator.

22. A band-gap reference voltage detection circuit comprising:

a Brokaw cell having a band-gap reference voltage;

a circuit portion for indicating the magnitude of an input voltage signal with respect to the band-gap reference voltage;

wherein the input voltage is applied to transistor bases of the Brokaw cell; and wherein the circuit portion is configured to digitally indicate the level of the input voltage signal relative to the band-gap reference voltage.

23. The detection circuit of claim 22, wherein the input voltage signal is proportional to a source voltage supplying current to the Brokaw cell, such that the circuit portion indicates the source voltage reaching a threshold level.

* * * * *

UNITED STATES PATENT AND TRADEMARK OFFICE

CERTIFICATE OF CORRECTION

PATENT NO. : 7,919,999 B2
APPLICATION NO. : 12/025587
DATED : April 5, 2011
INVENTOR(S) : Venkat Narayanan et al.

It is certified that error appears in the above-identified patent and that said Letters Patent is hereby corrected as shown below:

In column 13, line 36, in Claim 12, after “being” delete “is”.

Signed and Sealed this
Twenty-fourth Day of May, 2011

David J. Kappos
*Director of the United States Patent and Trademark Office*